US009805777B2

(12) United States Patent
Sandhu et al.

(10) Patent No.: US 9,805,777 B2
(45) Date of Patent: Oct. 31, 2017

(54) SENSE AMPLIFIER

(71) Applicant: ARM Ltd., Cambridge (GB)

(72) Inventors: Bal S. Sandhu, Fremont, CA (US);
Cezary Pietrzyk, Los Gatos, CA (US);
Robert Campbell Aitken, San Jose,
CA (US); George McNeil Lattimore,
Austin, TX (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/052,714

(22) Filed: Feb. 24, 2016

(65) Prior Publication Data

US 2017/0243622 A1    Aug. 24, 2017

(51) Int. Cl.
| | | |
|---|---|---|
| G11C 7/02 | (2006.01) | |
| G11C 7/22 | (2006.01) | |
| G11C 7/06 | (2006.01) | |
| H03F 3/45 | (2006.01) | |
| G11C 7/08 | (2006.01) | |
| G11C 13/00 | (2006.01) | |

(52) U.S. Cl.
CPC ............. *G11C 7/222* (2013.01); *G11C 7/062* (2013.01); *G11C 7/08* (2013.01); *G11C 13/004* (2013.01); *G11C 13/0007* (2013.01); *G11C 13/0069* (2013.01); *H03F 3/45179* (2013.01); G11C 2013/009 (2013.01); G11C 2013/0042 (2013.01); G11C 2013/0045 (2013.01); G11C 2013/0078 (2013.01); G11C 2213/15 (2013.01); H03F 2200/222 (2013.01); H03F 2200/471 (2013.01); H03F 2203/45044 (2013.01)

(58) Field of Classification Search
CPC ..... G11C 7/222; G11C 7/062; H03F 3/45179;
H03F 2200/222; H03F 2200/471; H03F 2203/45044
USPC ....... 365/207, 185.21, 174, 189.011, 189.15, 365/189.14, 190, 191, 198, 202, 206, 208, 365/210.11, 211, 212
See application file for complete search history.

(56) References Cited

U.S. PATENT DOCUMENTS

| | | | |
|---|---|---|---|
| 6,166,978 A | 12/2000 | Goto | |
| 6,538,476 B2 * | 3/2003 | Forbes | G11C 7/067 327/206 |

(Continued)

FOREIGN PATENT DOCUMENTS

WO    2009140299 A2    11/2009

OTHER PUBLICATIONS

U.S. Appl. No. 14/848,129, filed Sep. 8, 2015, 77 pages.

(Continued)

*Primary Examiner* — Fernando Hidalgo
(74) *Attorney, Agent, or Firm* — Berkeley Law & Technology Group, LLP

(57) ABSTRACT

Broadly speaking, embodiments of the present techniques provide an amplification circuit comprising a sense amplifier and at least one Correlated Electron Switch (CES) configured to provide a signal to the sense amplifier. The sense amplifier outputs an amplified version of the input signal depending on the signal provided by the CES element. The signal provided by the CES element depends on the state of the CES material. The CES element provides a stable impedance to the sense amplifier, which may improve the reliability of reading data from the bit line, and reduce the number of errors introduced during the reading.

13 Claims, 9 Drawing Sheets

(56) References Cited

U.S. PATENT DOCUMENTS

| | | | |
|---|---|---|---|
| 7,298,640 B2 | 11/2007 | Chen et al. | |
| 7,567,468 B2* | 7/2009 | Cheng | G11C 7/12 |
| | | | 365/189.07 |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 | 12/2016 | Sandhu et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 2005/0146965 A1* | 7/2005 | Kim | G11C 5/147 |
| | | | 365/211 |
| 2007/0096815 A1 | 5/2007 | Perner | |
| 2008/0106926 A1 | 5/2008 | Brubaker | |
| 2008/0107801 A1 | 5/2008 | Celinska et al. | |
| 2012/0176523 A1* | 7/2012 | Yoo | H04N 5/378 |
| | | | 348/301 |
| 2013/0020032 A1 | 1/2013 | Hata | |
| 2013/0214232 A1 | 8/2013 | Tendulkar et al. | |
| 2013/0285699 A1 | 10/2013 | McWilliams et al. | |
| 2015/0228322 A1 | 8/2015 | Jung et al. | |
| 2016/0124030 A1* | 5/2016 | Zhang | G01R 19/0092 |
| | | | 324/605 |
| 2016/0163978 A1 | 6/2016 | Paz De Araujo et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

OTHER PUBLICATIONS

Notification of Transmittal of the International Search Report and the Written Opinion of the International Searching Authority, or the Declaration, International Application No.: PCT/GB2017/050335, dated May 19, 2017, 1 pg.

International Search Report, International Application No.: PCT/GB2017/050335, dated May 19, 2017, 5 pgs.

Written Opinion of the International Searching Authority, International Application No.: PCT/GB2017/050335, dated May 19, 2017, 10 pgs.

\* cited by examiner

SENSE AMPLIFIER

FIELD OF THE INVENTION

The present techniques relate to sense amplifiers and more particularly, to sense amplifier circuits comprising a correlated electron switch.

BACKGROUND

Sense amplifiers are used in memory devices to read data from a memory. One example of a sense amplifier is a differential sense amplifier (also known as voltage mode sense amplifiers). A differential sense amplifier may be connected directly to bit lines, and may include a pair of transistors to read data from bit lines (complementary bit lines). The difference between bit line voltages determines the output of the amplifier. The performance of the differential sense amplifier may depend on the impedances of the bit lines. Ideally, the impedances of the pair of transistors should match to enable the differences between bit line voltages to be readily detected and amplified. Impedances for the pair of transistors are usually determined by resistive elements coupled to the transistors. Conventionally, these resistive elements may be Nwell resistors, poly resistors, and the like.

The conventional resistive elements are known to have some temperature dependence. The temperature dependence may cause the resistance values of the resistive elements to vary. Design considerations, such as, choosing appropriate sizes of resistors, are used to mitigate effects of temperature. However, choice of resistor sizes may not overcome variations in resistances that arise during manufacture. These variations in resistances result in mismatches at the inputs to the differential sense amplifier. The input mismatch results in an offset voltage in the sense amplifier. Other causes of offset voltages include unmatched parasitic capacitances and resistances at the inputs, or within the sense amplifier transistors, as well as mismatches in the differential pair transistor parameters caused by variations in the manufacturing process. The offset voltage introduces errors in read data. Consequently, there may be a loss of data due to the errors.

The present applicant has realized the need for an improved sense amplifier.

SUMMARY

According to a first aspect of the present techniques, there is provided a circuit comprising: an amplifier circuit comprising a first input to receive a first input signal, the amplifier being configured to amplify the at least one input signal; and an amplifier control circuit comprising at least one Correlated Electron Switch (CES) element, the amplifier control circuit coupled to the amplifier and arranged to provide at least one signal to the amplifier circuit to provide a stable impedance at the first input of the amplifier circuit.

According to related aspect of the present technique, there is provided a circuit. The circuit comprises an amplifier circuit comprising a first input to receive a first input signal and a second input to receive a second input signal. The amplifier circuit may be configured to amplify a difference between the first input signal and the second input signal. The circuit further comprises an amplifier control circuit comprising at least one Correlated Electron Switch (CES) element. The amplifier control circuit is coupled to the amplifier and arranged to provide at least one signal to the amplifier circuit to equalize impedances at the first input and the second input of the amplifier circuit.

According to a second aspect of the present technique, there is provided an apparatus. The apparatus comprises a plurality of memory cells, a plurality of sense amplifiers, and a plurality of CES elements. Each sense amplifier is coupled to at least one memory cell of the plurality of memory cells and configured to receive at least one bit line input corresponding to the at least one memory cell. The plurality of CES elements are coupled to the plurality of sense amplifiers. The first CES element of the plurality of CES elements is coupled between a respective sense amplifier and a first power source. The first CES element is programmed to a first impedance state to provide a first signal to the respective amplifier.

Preferred features are set out in the appended claims.

BRIEF DESCRIPTION OF THE DRAWINGS

The techniques are diagrammatically illustrated, by way of example, in the accompanying drawings, in which.

DETAILED DESCRIPTION

Figure 1:
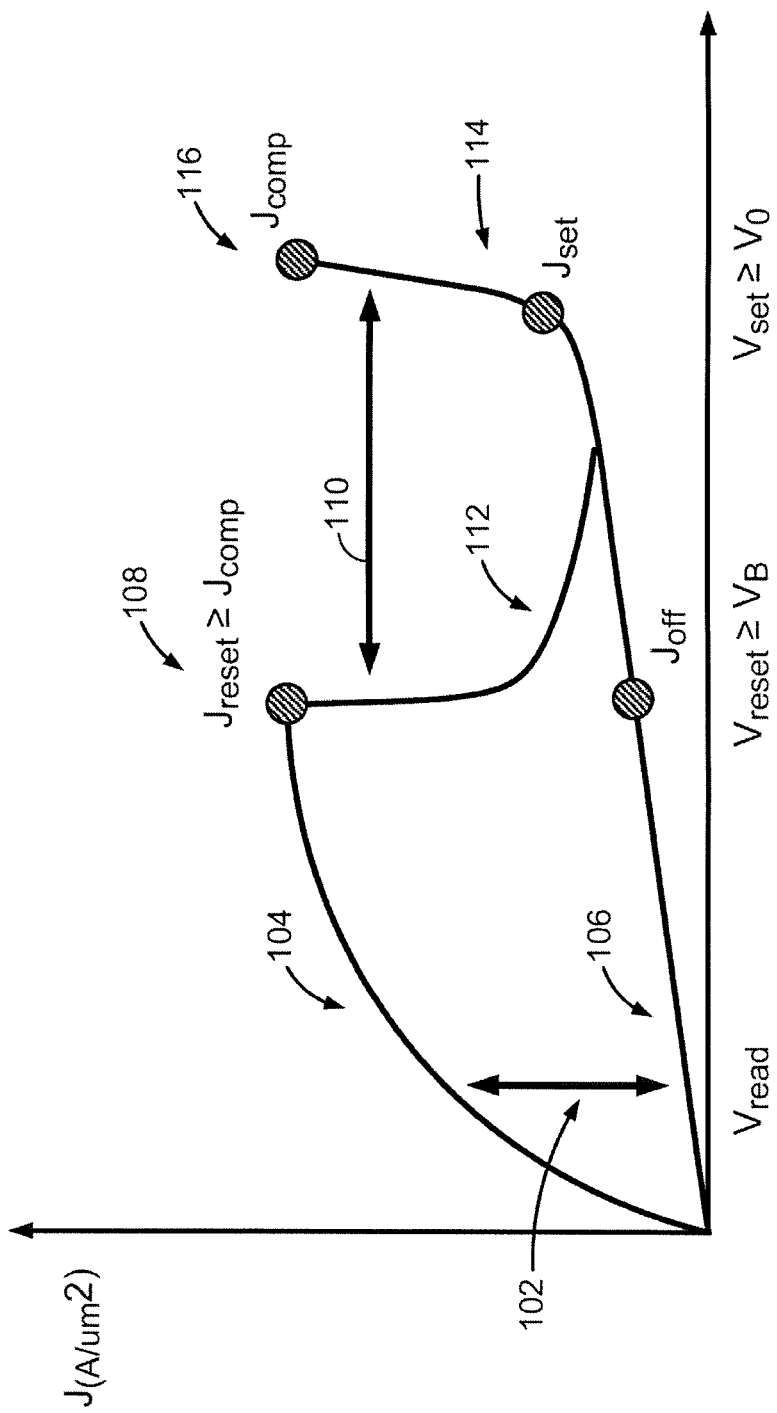
FIG. 1 shows a plot of current density versus voltage for a Correlated Electron Switch (CES) device.

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined by the long range ordering of the atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. However, these resistance-based memories have not proved to be commercially useful because their transition between the conductive and the insulating state depends on a physical structure phenomenon (e.g., melting at up to 600° C.) and returning to a solid state that cannot be sufficiently controlled for a useful memory in many applications.

Another variable resistance memory category includes materials that respond to an initial high "forming" voltage and current to activate a variable resistance function. The operation of resistive RAMs (ReRAMs) or conductive bridge RAMS (CBRAM) may be strongly temperature dependent, such that a resistive switching mechanism in a ReRAM/CBRAM may also be highly temperature dependent. Certain types of ReRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need for a non-volatile memory that is deterministic, has low power, high speed, high density and stability, and in particular, such a memory that is scalable to feature sizes well below 65 nanometers (nm).

Broadly speaking, embodiments of the present techniques generally provide a sense amplifier circuit comprising at least one Correlated Electron Switch (CES), also referred to herein as a CES element. The CES is used to provide a signal to the sense amplifier to enable the amplifier to amplify an input signal. The sense amplifier outputs an amplified version of the input signal depending on the signal provided by the CES element. As explained in more detail below, the CES element comprises a material that may transition between predetermined detectable memory states based at least in part on a transition of (at least a portion of) the material between a conductive state and an insulative state. The signal provided by the CES element depends on the state of the CES material. As mentioned above, conventional differential sense amplifiers use pairs of transistors to read data from bit lines and/or complementary bit lines (also referred to herein as 'bit line bar'), but variations in the impedances of the transistors may introduce errors in the data being read. In embodiments of the present techniques, the use of one or more CES elements may provide a stable impedance to the differential sense amplifier, which may therefore improve the reliability of reading data from the bit line, and reduce the number of errors introduced during the reading.

The term "correlated electron switch" is used interchangeably herein with "CES", "CES element", "CES device", "correlated electron random access memory", "CeRAM", and "CeRAM device".

A CES is a particular type of switch formed from (wholly or in part) a Correlated Electron Material (CEM). Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. The Mott criteria is defined by $(n_c)^{1/3} a=0.26$, where $n_c$ is a concentration of electrons and "a" is a Bohr radius. When a critical carrier concentration is achieves such that the Mott criteria is met, the Mott transition will occur and the state will change from high resistor (or capacitance) to low resistance (or capacitance).

The Mott transition of a correlated electron material (or of a CES element comprising a correlated electron material) may be controlled by the localization of electrons. When carriers are localized, the strong coulomb interaction between the electrons splits the bands of the material creating an insulator. When the electrons are no longer localized, the weak coulomb interaction dominates the band splitting is removed leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, the people can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

As mentioned above, a signal provided by a CES element to the amplifier in the amplifying circuit may be dependent on the state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive state and insulative state. As discussed in the particular example implementations below, material of a CES element sandwiched between conductive terminals may be placed in an insulative state (or "set" memory state) by application of a first programming signal across the terminals having a voltage $V_{reset}$ and current $I_{reset}$, or placed in a conductive state by application of a second programming signal across the terminals having a voltage $V_{set}$ and current $I_{set}$.

Additionally or alternatively, a CES element may be formed as a cross-tie memory device. The CES element may be CES memory cells, which may comprise a metal/CEM/metal (M/CEM/M) stack formed on a semiconductor. Such an M/CEM/M stack may be formed on a diode, for example.

In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$, required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}| > |V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
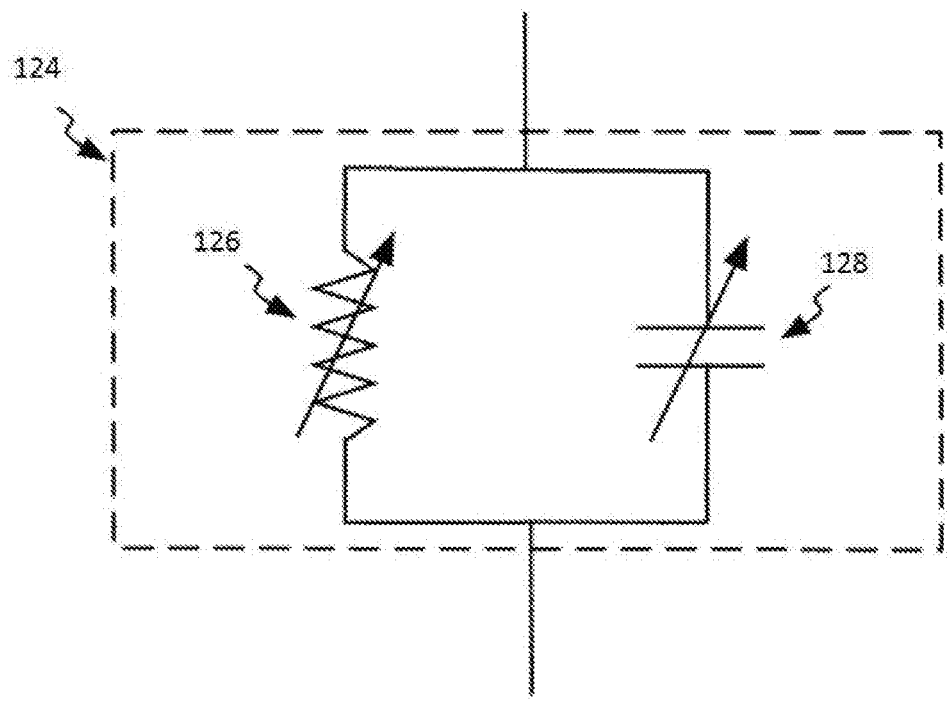
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

Figure 3:
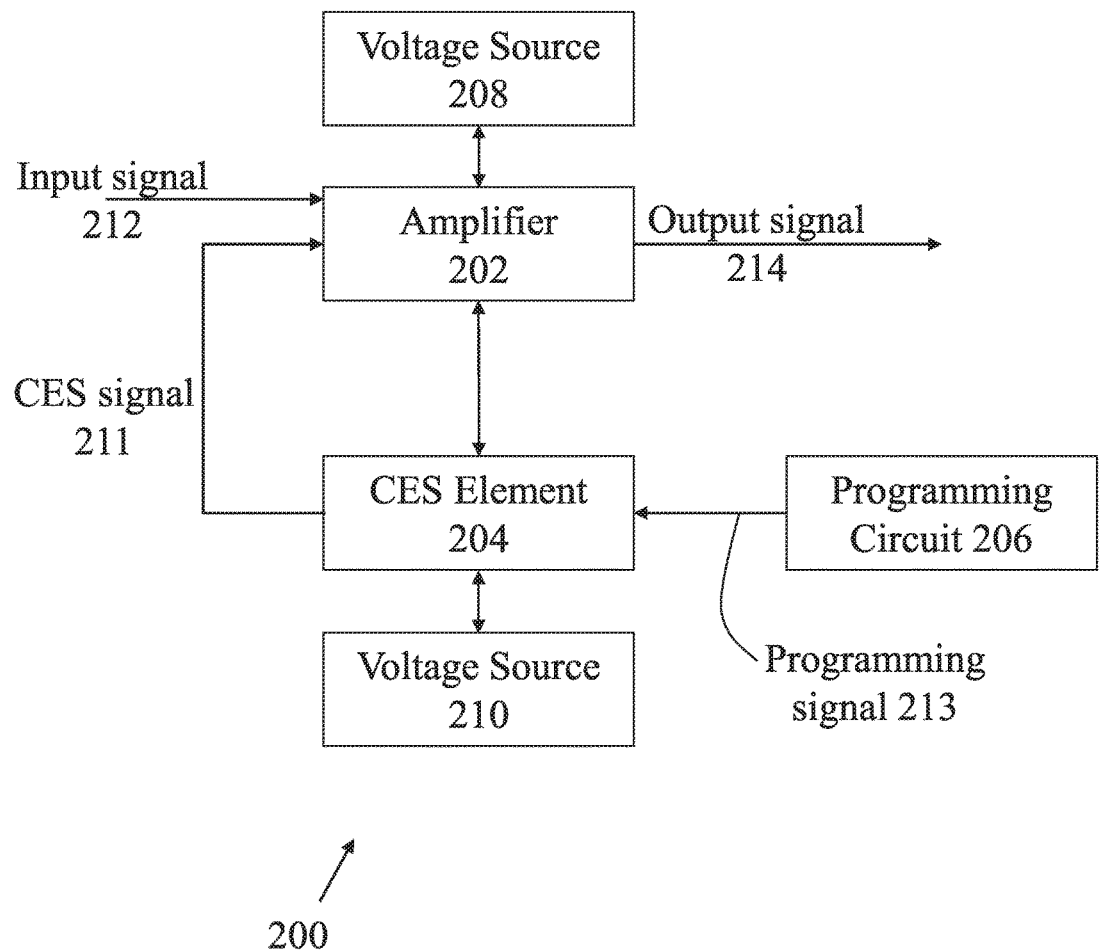
FIG. 3 illustrates an overview of an example circuit for CES-based differential sense amplifier.

Turning now to FIG. 3, this shows a schematic view of an amplification circuit 200 configured to amplify an input signal, according to an embodiment of the present techniques. The (amplifying) circuit 200 comprises an amplifier (or sense amplifier) 202, a correlated electron switch (CES) element 204, and a programming circuit 206. The amplifier 202 is coupled to a first voltage source 208 and to the CES element 204. In an embodiment, the first voltage source 208 may provide a positive supply voltage (e.g. a $V_{DD}$ supply source) to the amplifier 202. The first voltage source 208 is also referred to herein as a first reference voltage.

As mentioned above, a Correlated Electron Switch (CES) element is formed from a material which enables switching of the CES element between insulative and resistive states that is not temperature dependent/temperature sensitive. This may mean that the input(s) to the sense amplifier have substantially matching impedances that do not vary with temperature, unlike the conventional resistive elements described above. In some embodiments, equalization of the impedances may comprise substantially matching the impedances. The phrase "substantially matching impedances" is used interchangeably herein with the phrase "equalizing impedances".

The amplifier 202 is configured to receive an input signal 212, which is the signal to be amplified, and is configured to provide an output signal 214. The output signal 214 is an amplified version of the input signal 212. The amplifier 202 is configured to provide the output signal 214 dependent on a CES signal 211 provided to the amplifier 202 by the CES element 204. Thus, the amplifier 202 is further configured to receive CES signal 211 from the CES element 204. The CES element 204 is coupled to the amplifier 202 and to a second voltage source 210. The second voltage source 210 may be a ground GND source. The second voltage source 210 is also referred to herein as a second reference voltage. The CES signal 211 provided by the CES element is based on (dependent on) an impedance state of the CES element 204. An impedance state of the CES element 204 may correspond to a resistive state, a capacitive state or a combination thereof.

In embodiments, the amplification circuit 200 forms part of a memory device. Thus, in particular embodiments, the amplification circuit is being used as part of a memory read operation. Based on whether the amplification circuit is being used to read from a memory, or whether the memory device is being operated in a low power mode or in a high-performance, high power mode, the programming circuit 206 programs the CES element 204 into the required corresponding impedance state. (It is noted that the amplification circuit is generally used during a read operation, during which the CES element is programmed into a particular impedance state for e.g. low power mode or high-performance mode. The CES element is written to or programmed to be in a particular impedance state. The term "write" in the context of providing the CES element in a particular impedance state is used interchangeably herein with the term "program").

In embodiments, the CES element 204 may be switched between two impedance states. For example, the first impedance state may be a high impedance state, and the second impedance state may be a low impedance state, or vice versa. A high impedance state may be required, for example, when operating the amplifier circuit at a low current or low power, while a low impedance state may be required, for example, when operating the amplifier circuit a high current, or when a memory device is required to be in a high performance mode.

The programming circuit 206 programs an impedance state of the CES element 204 using a programming signal 213. The programming signal 213 may be a programming current, a programming current density, and/or a programming voltage. The programming circuit 206 provides a programming signal 213 (i.e. current, current density and/or voltage) to the CES element 204 based on a required impedance state (high or low Z) of the CES element. Since the difference between bit line voltages determines the output of the amplifier 202, the performance of the sense amplifier depends on the impedances of the bit lines. As mentioned earlier, the impedance state of the CES element 204 is not dependent on temperature (or at least, is not as temperature sensitive as conventional resistive elements). Thus, the CES element 204 may be able to provide a stable impedance to the amplifier 202, which enables the differences between bit line voltages to be readily detected and amplified, thereby reducing the errors in reading bit lines that arise when using conventional resistive elements.

Once the impedance state of the CES element 204 has been set by programming circuit 206, the CES element 204 provides the signal 211 to the amplifier 202. In one embodiment, the signal 211 is a current corresponding to the first, high impedance state, which may be a low current as required when operating at low power. Alternatively, the signal 211 is a current corresponding to the second, low impedance state, which may be a high current as required when operating in a high performance mode/at high power. The amplifier 202 reads the input signal 212 and outputs the output signal 214 depending upon the CES signal 211. The output signal 214 is an amplified version of the input signal 212.

The amplifier 202 may be implemented using a P-channel Metal-Oxide-Semiconductor (PMOS) transistor or an N-channel Metal-Oxide-Semiconductor (NMOS) transistor. The amplifier 202 as described herein is comprised of at least a single amplifier. In one embodiment, the amplifier 202 may be a sense amplifier. In the case of sense amplifier, the input signal 212 provided to the amplifier 202 is a bit line input. In another embodiment, the amplifier 202 may be a differential amplifier with a single ended output or a differential output. In the case of the differential amplifier with the single ended output, the input signal 212 comprises of two inputs, and the output is an amplified difference of the inputs. In the case of the differential amplifier with the differential output, the input signal 212 comprises of differential inputs, and differential outputs, the differential outputs are amplified differential inputs.

The non-volatile nature of the CES element 204 helps the amplifying circuit 200 to maintain the first impedance state regardless of when power or the voltage source 210 is disconnected from the CES element 204. Unlike conventional resistive elements, such as, Nwell and poly resistor, CES based impedances can be reprogrammed to a desired impedance value. As a result, the CES element 204 can be programmed multiple times to desired impedance values based on the requirements of the amplifier 202, thereby enhancing flexibility of operation.

In particular, the CES element 204 may be programmed into a high impedance state (e.g. 100 MΩ), which may be required for low current or low power operation, or it may be programmed into a low impedance state (e.g. 100 kΩ) for high performance operation. It is possible to switch the CES element 204 from a high impedance state to a low impedance state (and vice versa) as and when required. For example, if the CES element 204 is used with a large processor that is configured to perform multiple, and potentially complex, mathematical operations, the processor may be required to operate in a high performance, high power mode. In this case, the CES element 204 can be switched into a low impedance state. As soon as the processor is in an idle mode, e.g. when it stops performing the complex mathematical operations and is being used to perform routine operations instead, the CES element 204 can be switched immediately to a high impedance, low power mode. The CES element 204 state may be changed while the processor is switching between operations, such that the CES element 204 is in the appropriate impedance state for the processor during a given operation.

Figure 4:
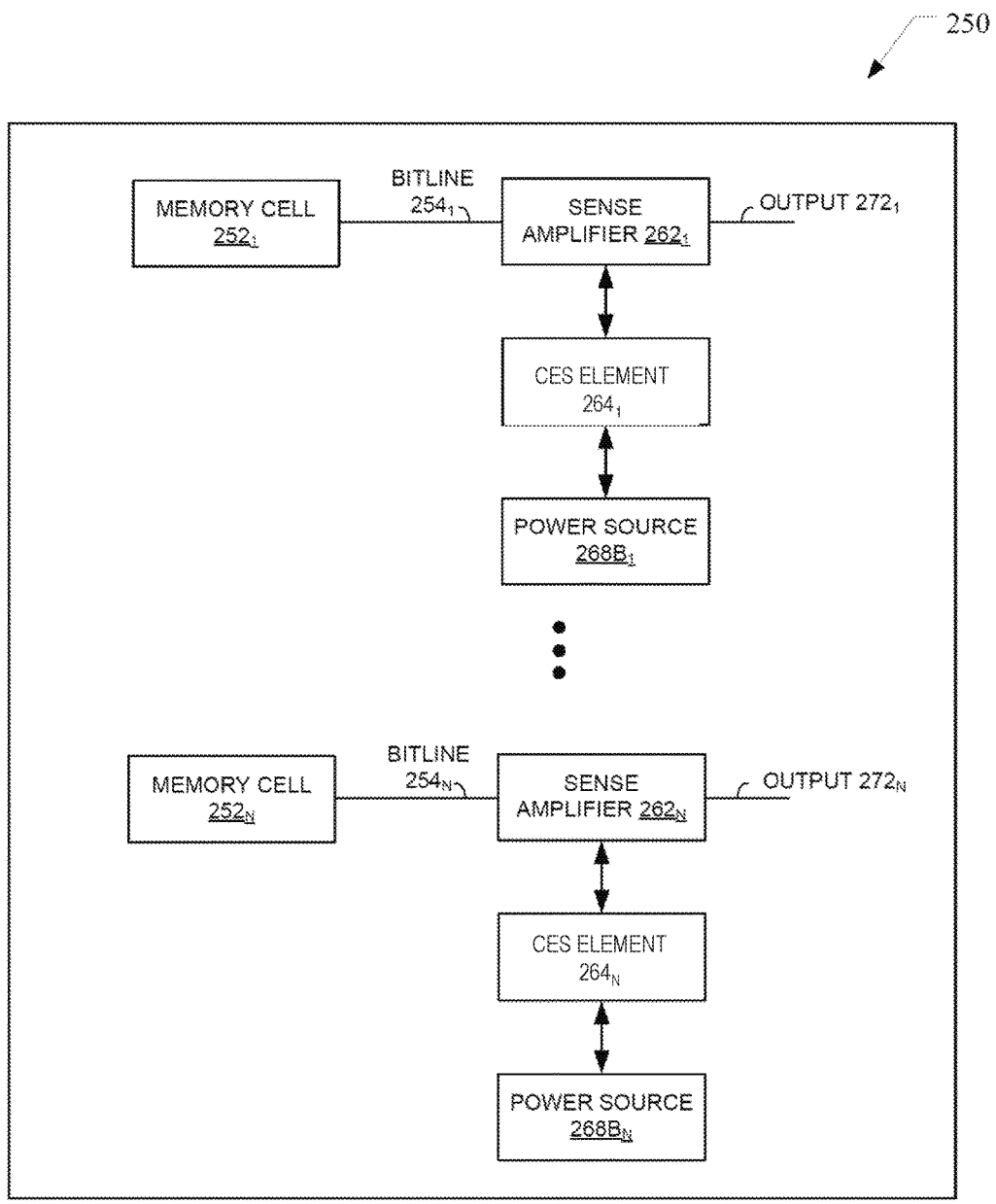
FIG. 4 illustrates a schematic view of an apparatus having at least one memory cell coupled to a sense amplifier.

FIG. 4 illustrates a schematic view of an apparatus 250, according to one embodiment of the present technique. The apparatus 250 may be a memory device. The apparatus 250 comprises a plurality of memory cells $252_{1-N}$, a plurality of sense amplifiers $262_{1-N}$, a plurality of CES elements $264_{1-N}$ and a plurality of power (voltage) sources $268_{1-N}$. In one example embodiment, the number of sense amplifiers $262_{1-N}$ in the memory device are set based on a width of a data bus and number of bits that is read from the memory device for a given read cycle.

Each sense amplifier of the plurality of sense amplifiers $262_{1-N}$ may be coupled to a respective memory cell $252_{1-N}$. Each CES element of a plurality of CES elements $264_{1-N}$ may be coupled to a respective sense amplifier $262_{1-N}$ and a respective power (voltage) source $268B_{1-N}$. For instance, in the example arrangement of FIG. 4, sense amplifier $262_1$ is coupled to a memory cell $252_1$, and CES $264_1$ is coupled to the sense amplifier $262_1$ and a power (voltage) source $268B_1$. The sense amplifiers $262_{1-N}$ shown in FIG. 4 may take any form, such as those described with reference to FIGS. 2 and 5 to 7. The power source $268B_{1-N}$ may be a ground source. In an embodiment, the CES element $264_1$ may be programmed into a first impedance state. The first impedance state may be a high impedance state or a low impedance state. The CES element $264_1$ provides a first signal to the sense amplifier $262_1$. In an embodiment, the first signal is a current. The sense amplifiers $252_1$ receives a bit line input $254_1$ from the memory cell $252_1$. The sense amplifier $252_1$ generates an output signal $272_1$. The output signal $272_1$ is an amplified bit line signal $254_1$.

The sense amplifier $262_1$ shown in FIG. 4 is configured to receive the bit line input $254_1$. In additional or alternative embodiments, the sense amplifier $262_1$ may be a differential amplifier configured to receive more than one bit line signal, such as, for example, a bit line signal and a bit line bar signal (also called the complementary bit line signal). In embodiments, the sense amplifier $262_1$ may comprise at least two transistors. One of transistors may be coupled to a bit line signal, while the other transistor may be coupled to the bit line bar signal. In this example, the sense amplifier $262_1$ may be coupled to a single CES element $264_1$ which is coupled to both transistors to provide a steady impedance to both transistors, or two CES elements that are separately coupled to one transistor. In either configuration, the or each CES element(s) is programmed to a required impedance state, depending on the operating state of the memory device (e.g. high power/performance, or low power). During operation of the apparatus 250, the CES element(s) may provide a CES signal(s) to the respective transistors. The transistors may read the bit lines and generate an output. The output is an amplified difference of the bit line inputs. An example of such implementation of differential amplifier is described below with respect to FIG. 5.

Figure 5:
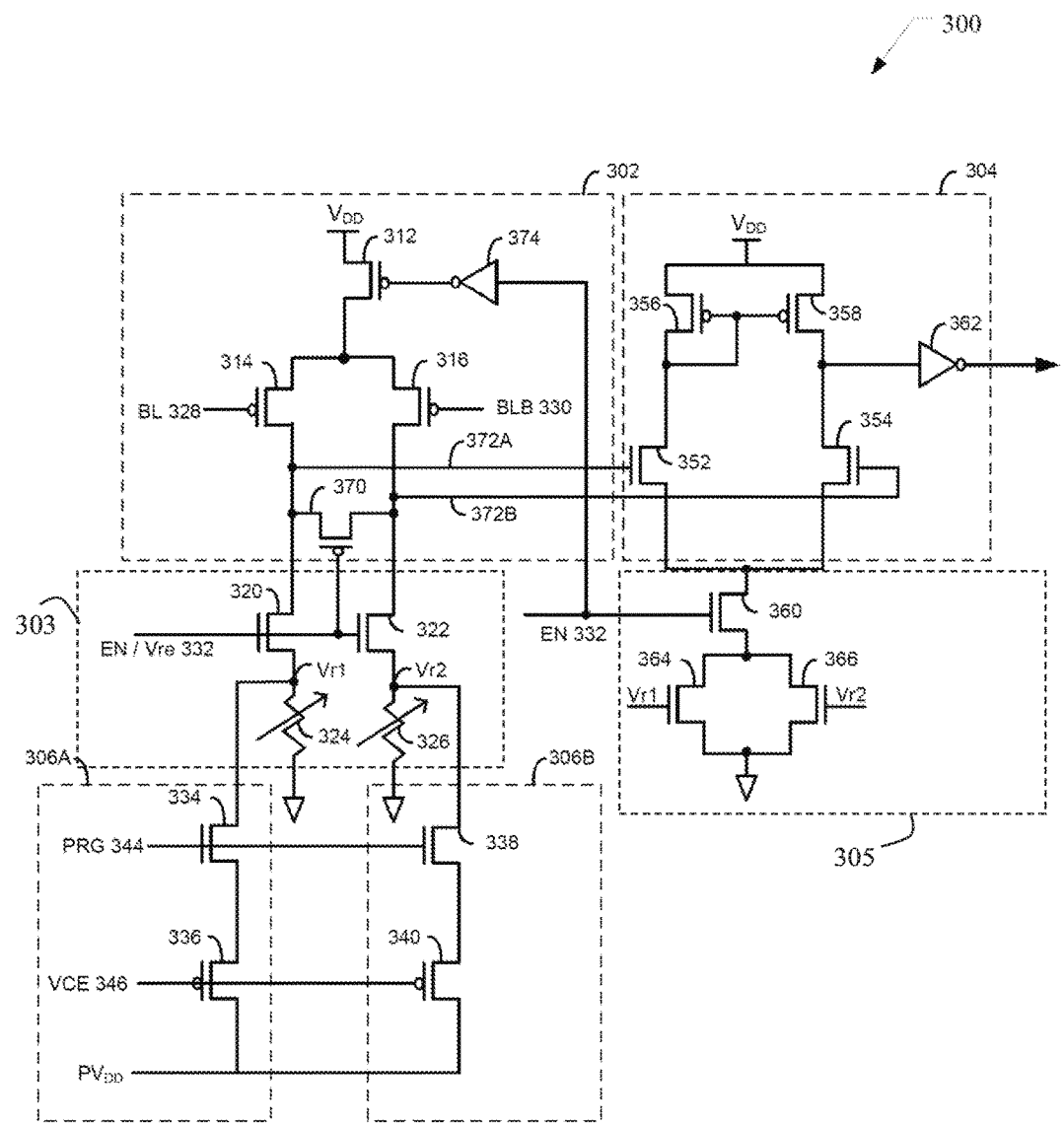
FIG. 5 illustrates an example circuit for a differential sense amplifier having two CES elements.

FIG. 5 illustrates an exemplary amplifier circuit 300, according to an embodiment. The circuit 300 comprises multiple circuit blocks 302, 303, 304, 305, 306A and 306B. Circuit block 302 comprises the circuitry for first stage amplification (c.f. amplifier 202 in FIG. 3), circuit block 303 comprises the circuitry for controlling the first stage amplification (c.f. the CES element 204 in FIG. 3), circuit block 304 comprises the circuitry for second stage amplification, circuit block 305 comprises the circuitry for controlling the second stage amplification, and circuit blocks 306A and 306B comprise the circuitry for programming the CES element(s) (c.f. programming circuit 206 in FIG. 3). The arrangement of the circuitry/components in each circuit block shown in FIG. 5 is merely for illustrative purposes, and any other circuit or arrangement of components which is capable of performing the same overall function of a particular block can be used.

Figure 7:
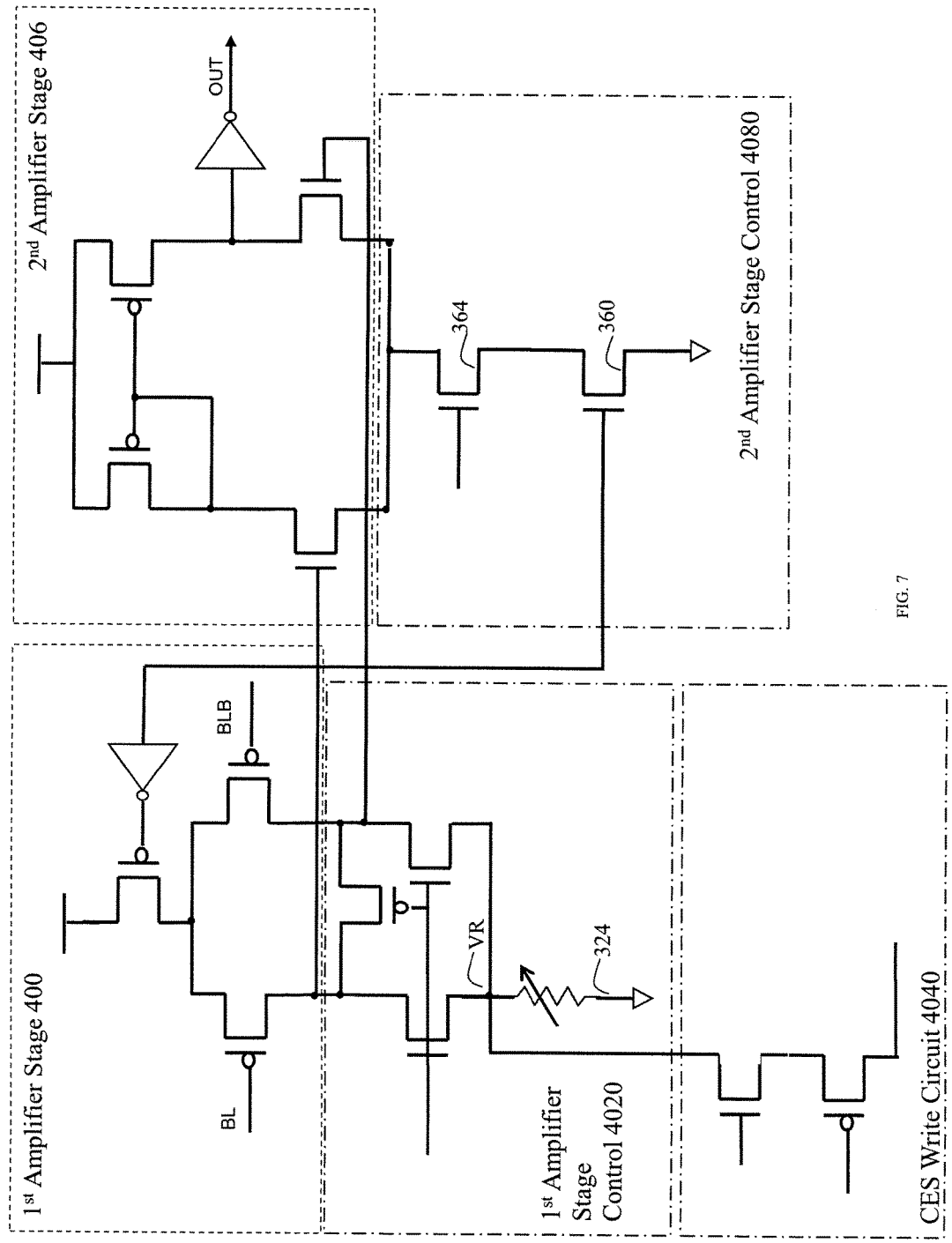
FIG. 7 illustrates an example circuit for a differential sense amplifier having one CES element.

Circuit block 302 performs the first stage amplification, and receives input bit line 328 and complementary bit line 330 signals. At least one transistor is coupled to each of the bit line 328 and the complementary bit line 330. The first stage amplifier amplifies a difference between the bit line and complementary bit line, as explained earlier. In the example shown in FIG. 5, the transistors coupled to the bit line and complementary bit line are coupled to variable resistor elements 324 and 326 of the first stage amplification control block 303. The variable resistor elements of block 303 may be correlated electron switches (CESs). Each CES 324, 326 is used to provide a steady impedance to the transistors, where each CES is not sensitive to temperature. In the depicted arrangement, two CES elements are used, but in alternative arrangements, a single CES element may be used to provide the steady impedance (as shown in FIG. 7 for example). Circuit blocks 306A and 306B (which may also be considered a single block 306), provide the programming circuitry to program the CES element(s) into a particular impedance state. The programming circuit provides a programming signal to the CES element(s) depending on, for example, whether the first stage amplification of block 302 is operating in a high power/performance or a low power/performance mode. The programming circuit programs the CES element(s) into a required impedance state, and in turn, block 303 provides a steady impedance to the first stage amplifier of block 302. The amplifier of block 302 is then able to perform the first stage amplification of the difference between the bit line and the complementary bit line.

Circuit block 304 provides second stage amplification, in case the signal produced by the first stage amplifier of block 302 is not sufficient. Additionally or alternatively, circuit block 304 is configured to convert a dual rail signal into a single rail output signal. The second stage amplifier may be any type of amplifier, and need not take the precise form depicted in FIG. 5. Circuit block 305 provides the control circuitry that controls the second stage amplifier of block 304.

Turning now to circuit block 302, which performs the first stage amplification, in an example arrangement, the block 302 comprises a differential amplifier that is coupled to a first CES element 324 and a second CES element 326 of circuit block 303. The first stage differential amplifier shown in FIG. 5 comprises a PMOS transistor 312, a PMOS transistor 314 and a PMOS transistor 316. The transistor 314 is connected to the transistor 312 and an NMOS transistor 320 as shown. A bit line BL 328 is connected to a gate input of the transistor 314. Similarly, the transistor 316 is connected to the transistor 312 and an NMOS transistor 322 at a drain input. A bit line bar (complementary bit line) BLB 330 is provided at a gate input of the transistor 316. The transistor 312 is connected to a first voltage supply, which may in embodiments be power supply $V_{DD}$. The transistor 312 is provided with an inverted EN 332 at a gate input. The first differential amplifier block 302 is coupled to the CES elements 324-326 through the transistor 320 and the transistor 322. CES elements 324 and 326 may also be coupled to a second voltage supply, which may be ground. The transistor 320 and the transistor 322 enable or disable a connection between the first differential amplifier block 302 and the CES elements 324-326. The transistor 320 is connected to the CES element 324. Similarly, the transistor 322 is connected to the CES element 326. Gate inputs of the transistor 320 and the transistor 322 are connected to the enable signal EN 332 signal.

In addition to the first differential amplifier block 302, the CES element 324 and the CES element 326 of the first control block 303 are also coupled to the programming blocks 306A and 306B. In FIG. 5, programming block 306A and programming block 306B are coupled to the CES element 324 and CES element 326 respectively. The programming block 306A provides a first programming signal to the CES element 324 to program the CES element 324 at a first impedance state. Similarly, the programming block 306B provides a second programming signal to the CES element 326 to program CES element 326 at the first impedance state. Both CES elements 324 and 326 are programmed into the same impedance state. Accordingly, in an alternative arrangement, a single CES element may be used to provide a particular impedance state, which may be programmed by a single programming block.

The programming (or write blocks) 306A, 306B shown in FIG. 5 depict one particular arrangement of programming (or write) circuitry, used to program the impedance of the CES element(s) used in the amplifier control circuit. Examples of alternative programming circuitry can be found in the Applicant's pending U.S. patent application Ser. No. 14/826,110 which is incorporated herein by reference in its entirety. One of the key functions of the programming blocks 306A, 306B is that they provide both a particular voltage and a particular current in order to program the CES elements 324 and 326 into a particular impedance state. In FIG. 1, the first voltage ($V_{reset}$) required to program the CES element into a first impedance state is lower than the second voltage ($V_{set}$) required to program the CES element into a second impedance state. Similarly, the first current or current density ($J_{reset}$) required to program the CES element into a first impedance state is higher than the second current or current density ($J_{set}$) required to program the CES element into a second impedance state. Accordingly, the programming blocks 306A, 306B function to provide the current and/or voltage signals required to program the CES element into the impedance states. Alternative programming circuitry are described below with reference to FIGS. 8 and 9.

In the example depicted in FIG. 5, the programming circuit block 306A includes an NMOS transistor 334 and a PMOS transistor 336. A drain input of the transistor 334 is connected to the CES element 324, a source input of the transistor 334 is connected to a drain input of the transistor 336, and a gate input of the transistor 334 is connected to a program enable signal (PRG) 344. Further, a source input of the transistor 336 is connected to a programmable voltage supply, which may be $V_{DD}$ ($PV_{DD}$), and a gate input of the transistor 336 is connected to an analog voltage (VCE) 346. Similarly, the programming circuit 306B includes an NMOS transistor 338 and a PMOS transistor 340. A drain input of the transistor 338 is connected to the CES element 326, a source input of the transistor 338 is connected to a drain input of the transistor 340, and a gate input of the transistor 338 is connected to the PRG 344. Further, a source input of the transistor 340 is connected to a programmable voltage supply, which may be $PV_{DD}$, and a gate input of the transistor 340 is connected to the VCE 346.

The programming circuits 306A-B provide the first programming signal and the second programming signal during a write or program operation for the CES elements. The program operation is initiated by disabling the transistors 320-322 to disconnect the CES elements 324-326 from the first differential amplifier 302. The transistors 320-322 are disabled by providing a 0V at the EN 332. To program the CES elements 324, 326 into a high impedance state, PRG 344 is set to $V_{DD}$, and to program the CES elements into a low impedance state, the PRG 344 is set to $V_{DD}+V_{TH}$, where $V_{TH}$ is a threshold voltage. Setting the PRG 344 at the $V_{DD}$ enables the programming circuits 306A-B. The VCE 346 and the $PV_{DD}$ are applied to the transistor 336 and the transistor 340 to generate the first programming signal and the second programming signal, respectively. The VCE 346 determines a current density of the transistor 336 and the transistor 340. The VCE 346 may be set at an appropriate value to control the current. In response to the VCE 346, the transistor 336 and the transistor 340 draw a proportionate current value, that is a first current. Also, based on the VCE 346 and the $PV_{DD}$, a first voltage is determined. The first programming signal, that is, the first current and the first voltage is applied to the CES element 324 from the transistor 336, and the second programming signal, that is, the first current and the first voltage is applied to the CES element 326 from the transistor 340. Based on the first programming signal and the second programming signal, a desired impedance state is achieved in the CES element 324 and the CES element 326. The desired impedance state may be the high impedance state (reset state) or the low impedance state.

In one embodiment, since the transistor 334 and the transistor 338 are NMOS transistors, the PRG 344 is set to $V_{DD}$ for configuring the CES elements 324 and the CES element 326 into a high impedance state (reset state). The PRG 344 is set to $V_{DD}+V_{TH}$ for configuring the CES element 324 and the CES element 326 into a low-impedance state (set state), where $V_{TH}$ is a threshold voltage of the transistor 334 and the transistor 338.

In one example implementation, the transistor 334 and the transistor 338 are designed to achieve a voltage drop such that a voltage across the CES element 324 and the CES element 326 is lower than the first trigger voltage. For example, thick-gates may be used for the transistor 334 and the transistor 338, and the PRG 344 is provided with voltage slightly above $V_{DD}$ to achieve the $V_{TH}$ drop across the transistor 334 and the transistor 338, respectively to limit a maximum value of voltage across the CES element 324 and the CES element 326.

In another example embodiment, PMOS transistors can be used instead of the transistor 334 and the transistor 338 to avoid providing additional voltage to the on gates of transistor 334 and the transistor 338 during a program operation, to set the CES elements 324-326 into a low impedance state. With PMOS transistors for the transistors 334 and the transistor 338, the PRG 344 is set to a voltage slightly higher than $V_{SS}$ for configuring the CES element 324 and the CES element 326 into the high impedance state. The PRG 344 is set at $V_{SS}$/GND for configuring the CES element 324 and the CES element 326 to the low impedance state. The PRG 344 is set to the VDD to disconnect the programming circuits 306A-B from the CES element 324 and the CES element 326.

In one embodiment, the programming circuit 306A and the programming circuit 306B can be configured to program the CES element 324 and the CES element 326 without having the transistor 334 and the transistor 338. The $PV_{DD}$ applied to the transistor 336 and the transistor 340 may be controlled to provide the first voltage and a second voltage. The first voltage and the first current are applied to program the CES element 324 and the CES element 326 into a first impedance state. Similarly, the second voltage and second current may be applied to the CES element 324 and the CES element 326 to achieve the second impedance state.

The VCE 346 and the $PV_{DD}$ are applied to the transistor 336 and the transistor 340 to generate the first programming signal and the second programming signal, respectively. The VCE 346 determines a current density of the transistor 336 and the transistor 340. The VCE 346 may be set at appropriate values to control a current. In response to the VCE 346, the transistor 336 and the transistor 340 draw a proportionate current value, that is a first current. Also, based on the VCE 346 and the $PV_{DD}$, a first voltage is determined. The first programming signal, that is, the first current and the first voltage is applied to the CES element 324 from the transistor 336, and the second programming signal, that is, the first current and the first voltage is applied to the CES element 326 from the transistor 340.

The impedance values of the CES element 324 and the CES element 326 are constant/fixed until the CES element 324 and the CES element 326 are reprogrammed. Upon programming the CES elements 324 and the CES element 326, the PRG 344 is driven to 0V, and the VCE 346 is made equal to the VDD to disconnect the programming circuits 306A-B from the CES element 324 and the CES element 326.

In a read operation, a high signal is provided on the gate of the transistor 320 and the transistor 322. In an embodiment, if the transistors 320 and the transistor 322 are thick gate transistors (e.g. have a thick oxide layer), then $V_{DD}$ is provided as EN 332. In this case, the threshold voltage $V_{TH}$ is larger (e.g. 0.6V) than for a thin gate transistor having a thin oxide layer, where $V_{TH}$ may be 0.3V for example. In another embodiment, if the transistors 320 and the transistor 322 are thin gate transistors, then $V_{DD}$-Vth is provided as Vre 332. The EN 332 or the Vre 332 switches ON the transistors 320 and 322. The transistor 320 and the transistor 322 in ON state connect the CES element 324 to the transistor 314, and the CES element 326 to the transistor 316. In the read operation, the CES element 324 and the CES element 326 provide a first and a second signal to the first differential amplifier 302. In particular, the CES element 324 and the CES element 326 provide the first signal and the second signal to the transistor 314 and the transistor 316, respectively. In an embodiment, the first signal and the second signal are a current signal in response to voltage across the CES element 324 and the CES element 326 and the impedance state of the CES element 324 and the CES element 326.

The first signal passes through the transistor 314 and the transistor 320, and the second signal passes through the transistor 316 and the transistor 322. The transistor 314 and the transistor 316 read data in form of differential input voltages through the BL 328 and the BLB 330. The first differential amplifier 302 receives a differential input voltage (VBL-VBLB). The differential input voltages cause a differential current in the first differential amplifier 302. The differential current then sets the bias operating point for the two CES resistors as follows:

$$Vr1 = I_{314} * R1 = Vre - Vth4 \qquad 1$$

$$Vr2 = I_{316} * R1 = Vre - Vth5 \qquad 2;$$

where the Vr1 and the Vr2 are voltages at the first input of the CES elements 324-326, respectively; $I_{314}$ represents a current through the transistor 314; the $I_{316}$ represents a current through the transistor 316; the R1 represents a impedance value provided by the CES element 334-336; the Vre 332 represents a reference voltage that is equal or lower than the first supply voltage $V_{DD}$, based on an oxide of the transistors 320 and the transistor 322; Vth4 represents a threshold voltage of the transistor 320; Vth5 represents a threshold voltage of the transistor 322.

As explained earlier, both the voltage and current/current density of a CES element need to be changed/programmed in order to switch the CES into a different impedance state. This means that it is possible to prevent unintentionally programming during a read operation. For example, if during a read operation the current density applied to the CES element increases up to or beyond the current density required to reset/rewrite (Jreset), the CES element will not accidentally cause a rewrite operation unless the voltage also reaches Vreset. Similarly, if Vreset is reached but Jreset is not reached, then no unintentional write operation occurs.

Accordingly, in embodiments, the Vr1 and the Vr2 are maintained below Vreset to ensure that an impedance of the CES element 324 and the CES element 326 are not changed, where the Vreset voltage represents a trigger voltage of a CES element to switch to a different impedance state. This is achieved by having the transistors 320-322, the transistor 334 and the transistor 338 with thick-gates and appropriately sized, such that Vth of the aforementioned transistors are between 0.5V-0.6V to ensure that the voltages on nodes Vr1 and Vr2 never reaches or exceeds the Vreset voltage of 0.6V. In embodiments, it may be critical that transistors 320 and 322 provide a sufficient drop between the first voltage supply and the CES elements 324-326 regardless of whether they are thin or thick oxide devices (through either use of Vt drop, or Vt drop plus lower gate supply). This voltage drop, in addition to limiting the current flowing through the path between transistor 312 to transistor 314/316 to transistor 320/322, prevents an accidental or unintentional programming of the CES devices. As mentioned earlier the CES elements 324, 326 require both a specific voltage and specific current to change their impedance state. The CES elements shown in FIG. 5 are generally in a 'read' mode (see FIG. 1) during the amplification operation of the sense amplifier. (A discussion on how the CES elements are programmed is provided above.) Alternatively, the transistors 320-322 with thin-gates may be used with, and the EN 332 be replaced with a reference signal, for example Vre 332 signal (0.8V) to limit the voltages on Vr1 and Vr2 below the Vreset.

The differential output 372A and 372B generated by the first differential amplifier 302 are input to a second differential amplifier 304. The differential output 372A and 372B is the amplified differential input to the second differential amplifier.

In one embodiment, the first differential amplifier 302 may also include a PMOS transistor 370 coupled between the transistor 314 and the transistor 316. The transistor 370 is coupled to the drain input of the transistor 314 and the transistor 316 to cancel any offset voltage between the transistor 314 and the transistor 316 prior to the read operation, at an end of a read operation or during a standby mode. The transistor 370 is automatically turned off during the read operation as a result of a high signal supplied to a gate of the transistor 370. In an alternate embodiment, a NMOS transistor may be provided in place of the transistor 370 with an inverted EN 332 to cancel any offset voltage.

The second differential amplifier 304 includes a NMOS transistor 352, a NMOS transistor 354, a PMOS transistor 356, a PMOS transistor 358 and an inverter 362. A drain input of the transistor 352 is coupled to a drain input of the transistor 356, and a source input of the transistor 352 is coupled to a drain input of a NMOS transistor 360. The transistor 352 receives the differential output 372A on a gate input. Similarly, a drain input of the transistor 354 is coupled to a drain input of the transistor 358 and a source input of the transistor 354 is coupled to the drain input of the transistor 360. The transistor 354 receives the differential output 372B on a gate input. The transistor 356 and the transistor 358 are coupled to the $V_{DD}$ on a source input. A gate input of the transistor 356 and the transistor 358 are coupled to the drain input of the transistor 352. The transistor 360 is coupled to a NMOS transistor 364 and a NMOS transistor 366 on the drain input. The transistor 364 and the transistor 366 are coupled to a voltage supply (e.g. to a ground) on a source input. In other words, the transistor 364 and the transistor 366 are coupled in parallel. The transistor 364 receives the first signal at a gate input. Similarly, the transistor 366 receives the second signal at a gate input.

The second differential amplifier 304 is driven by the transistor 360, the transistor 364 and the transistor 366. The transistor 360 couples the second differential amplifier 304 with the transistor 364 and the transistor 366 in response to the EN 332. The transistor 356 and the transistor 358 form a current mirror to provide a current to the transistors 352 and 354. The transistor 352 and the transistor 354 amplify received differential voltages 372A-372B. The second differential amplifier 304 outputs the differential voltages 372A-372B through the inverter 362. The output signal may be latched when the sense amplifier 300 is powered down at the end of the read cycle. The transistor 364 and the transistor 366 are configured in saturation, ensure that the supplied current to the transistors 352-354 are less susceptible to variations. The output may be latched when the second differential amplifier 304 is powered down at the end of the read operation.

Although the circuit 300 shows the CES element 324 and the CES element 326 to provide the first signal and the second signal to the transistor 314 and transistor 316, respectively, it can be appreciated that more than one CES element can be used in place of each of the CES element 324 and the CES element 326. In one embodiment, more than one CES element may be used in parallel in place of each of the CES element 324 and the CES element 326. In another embodiment, more than one CES element may be used in series in place of each of the CES element 324 and the CES element 326. In yet another embodiment, more than one CES element may be used in combination of series and parallel connection may be used in place of each of the CES element 324 and the CES element 326. In the aforementioned embodiments, appropriate programming circuits may be used to program the CES elements. The programming circuits may be configured to program the CES elements to generate corresponding values of current for the transistor 314 and the transistor 316 of the first differential amplifier 302. Based on the impedance value of the CES elements power and/or speed of the differential amplifier 302 may be controlled.

Figure 6:
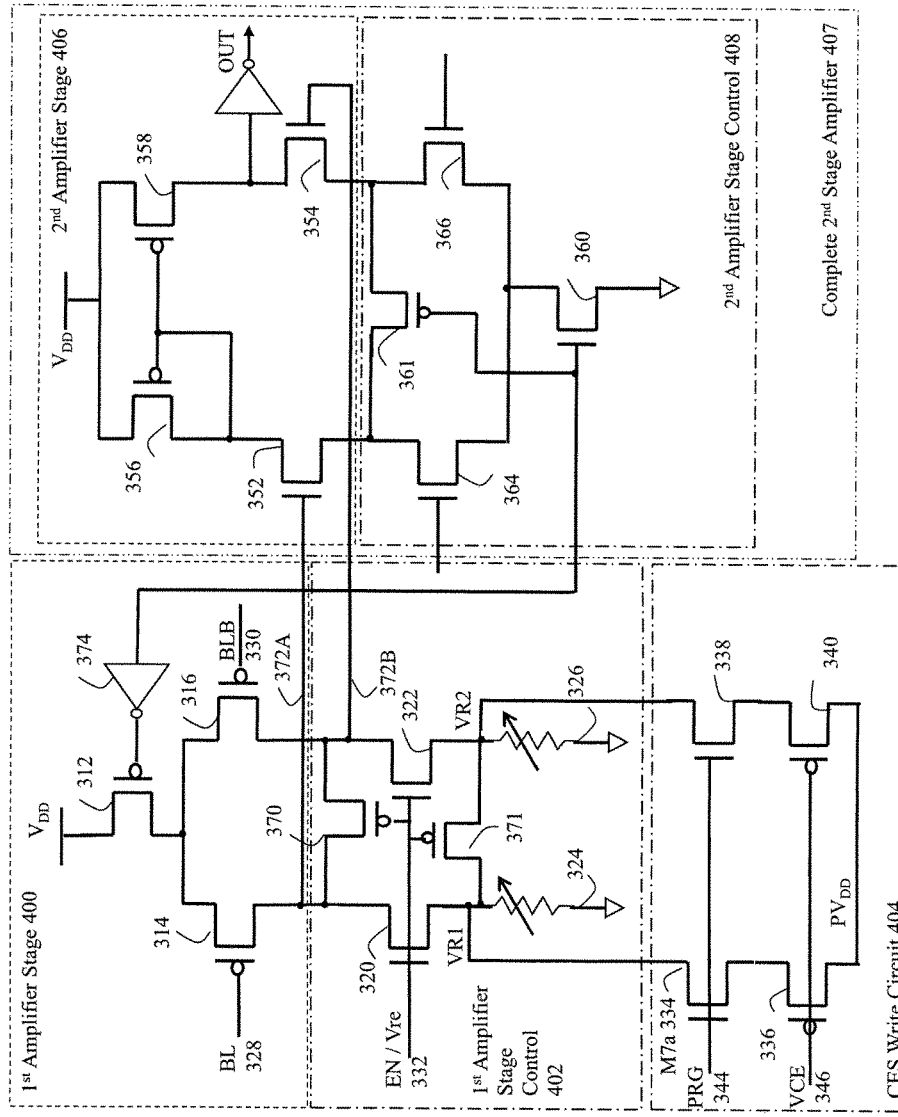
FIG. 6 illustrates a further example circuit for a differential sense amplifier having two CES elements.

FIG. 6 illustrates a further example circuit for a differential sense amplifier having two CES elements. Throughout the following description, like references shall be used to describe like parts. Many of the features of the amplification circuit of FIG. 6 are similar to those of the circuit 300 shown in FIG. 5. Thus, the following description will focus on the differences between the circuits. Here, first amplifier circuit block 400 is substantially similar to first amplifier circuit block 302 in FIG. 5, second amplifier circuit block 406 is substantially similar to second amplifier circuit block 304 in FIG. 5, first amplifier control block 402 is substantially similar to first amplifier control block 303 in FIG. 5, and programming (write) circuit block 404 is substantially similar to program circuit blocks 306A and 306B in FIG. 5. In FIG. 6, the second amplifier control block 408 is modified with respect to block 305 in FIG. 5. In the second amplifier control block 408 here, transistor 360 has been moved below transistors 364 and 366. This gives rise to a higher gain (compared to the embodiment of FIG. 5) in the combination of the second amplifier circuit block 406 and the second amplifier control block 408, (which together act as the complete second stage amplifier 407), since the second stage amplification depends on transistors 364 and 366 (control block) as well as transistors 352 and 354.

In other words, the higher gain is due to the combined effect of the second amplifier circuit block 406 and the second amplifier control block 408. Thus, the second amplifier circuit block 406 and the second amplifier control block 408 may be considered the complete second stage amplifier 407, as indicated by the box in FIG. 6. The two blocks work together, since the current through the second amplifier circuit block 406 is dependent on the second amplifier control block 408. Furthermore, the amplification increase which results using the circuit of FIG. 6 (relative to the embodiment of FIG. 5) is due to different current passing through transistors 364 and 366 in the second amplifier control block 408. This causes the additional amplification.

It will also be appreciated that rather than use two separate CES devices 324 and 326, an alternative embodiment of the first amplifier control circuit block 303 comprises only a single CES element that is coupled to both the source of transistor 320 and transistor 322. An example amplification circuit comprising a single CES device is shown in FIG. 7. In this arrangement, first amplifier control circuit block 4020 comprises a single CES device 324, and nodes Vr1 and Vr2 in FIG. 5 are replaced by a single node VR. This may simplify the overall amplification circuit as well as reduces the number of components (transistors, CES, etc) required. Only one programming/write circuit 306 is required. Similarly, in the second amplifier control circuit 4080, only transistor 364 is needed compared with FIG. 5, and transistor 366 is not needed since there are is only a single node VR in the first amplifier control block 4020. This arrangement may impact the performance of the overall amplification circuit but will also reduce the area required on a memory chip/integrated circuit. Furthermore, there may be improved common mode noise rejection since there is only a single node rather than separate nodes Vr1 and Vr2.

Turning back to FIG. 5, although the above circuit 300 are illustrated to have a mix of NMOS transistors and PMOS transistors, circuit 300 can be modified to have only PMOS transistors or only NMOS transistor with appropriate modification, without affecting the function of the circuit 300. Also, alternate circuit components can be used altogether to achieve the above functionality, without departing from the scope of the technique. However, in order to achieve this, the voltages at Vr1 and Vr2 may need to be kept below a trip voltage which would cause a disturb of the CES devices.

The CES element is known to have lower manufacturing variations than an NWell or Rpoly resistor. Using the CES element in place of a conventional resistor in the differential sense amplifier eliminates impedance mismatch issues. Also, the CES element is reprogrammable on silicon, thereby providing an end user with flexibility to modify impedance value when required. Also, a circuit designer is benefited by the CES element as the designed need not perform a GDSII layout mask (a database file format which is an industry standard for data exchange of integrated circuit or IC layout artwork) change to adjust the value of the resistance. As a result, using the CES saves cost and time to market. In addition, the CES element has more stable temperature coefficient then NWell or Rpoly resistors, thereby providing more operating stability, less variations and good immunity in the circuits. Furthermore, the CES element design can be made low power, low speed or high power, high speed by reprogramming the CES element on silicon. Also, the CES element consumes less current during reprogramming in comparison to other circuit elements.

Figure 8:
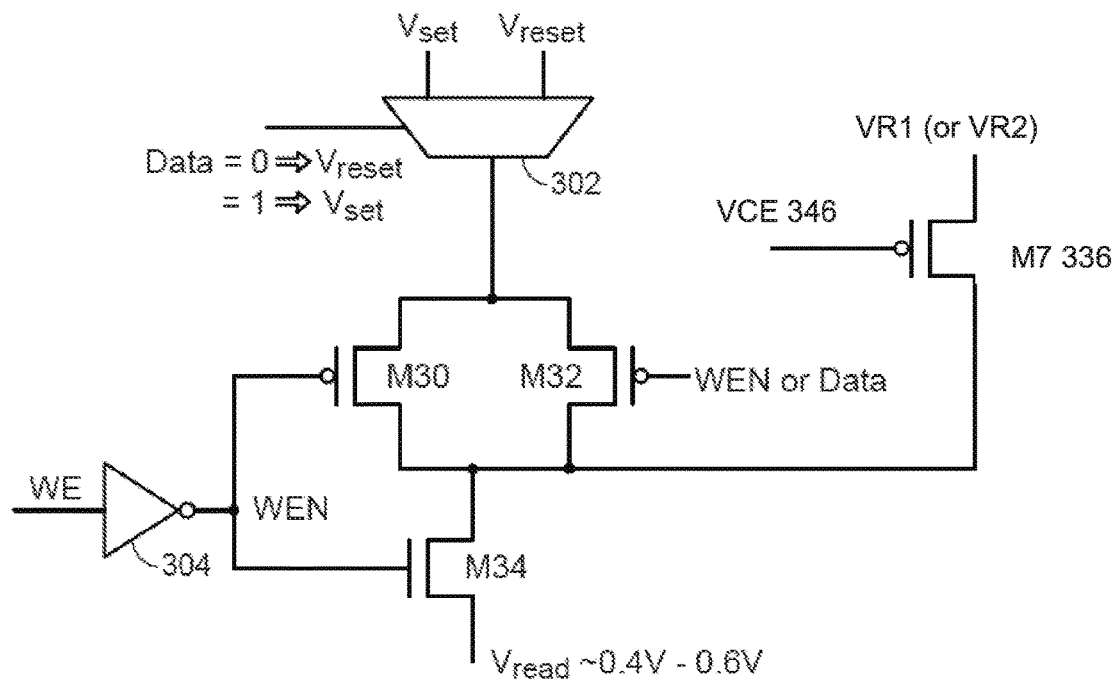
FIG. 8 illustrates an alternative write driver circuit for the circuits of FIGS. 5 to 7.
Figure 9:
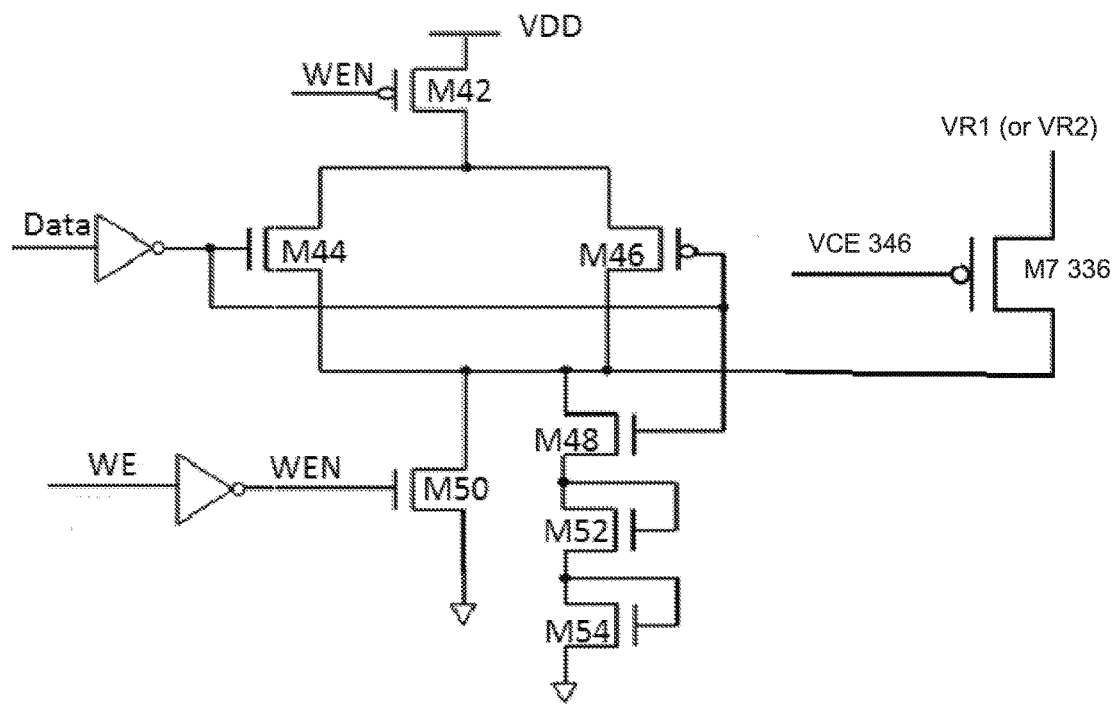
FIG. 9 illustrates a further alternative write driver circuit for the circuits of FIGS. 5 to 7.

As mentioned earlier, the programming or write blocks 306 shown in FIGS. 5, 6 and 7 depict one particular arrangement of programming or write circuitry. One of the key functions of the write blocks is to provide the current and/or voltage signals required to program the CES element into the required impedance states. FIG. 8 illustrates alternative write circuitry for the circuits of FIGS. 5 to 7. The circuitry shown in FIG. 8 may be coupled to the or each CES element, by way of transistor 336 as shown. FIG. 8 illustrates a further alternative write circuitry for the circuits of FIGS. 5 to 7. The circuitry shown in FIG. 9 may be coupled to the or each CES element, by way of transistor 336 as shown.

Although illustrative embodiments of the present techniques have been described in detail herein with reference to the accompanying drawings, it is to be understood that the techniques are not limited to those precise embodiments, and that various changes and modifications can be effected therein by one skilled in the art without departing from the scope and spirit of the disclosure as defined by the appended claims.

What is claimed is:

1. A circuit comprising:
an amplifier circuit comprising a first input to receive a first input signal, the amplifier being configured to amplify the first input signal; and
an amplifier control circuit comprising at least one Correlated Electron Switch (CES) element, the amplifier control circuit coupled to the amplifier and arranged to provide at least one signal to the amplifier circuit to provide a stable impedance at the first input of the amplifier circuit, wherein the amplifier circuit comprises a second input to receive a second input signal, wherein the amplifier circuit is configured to amplify a difference between the first input signal and the second input signal, and wherein the amplifier control circuit is configured to provide at least one signal to the amplifier circuit to equalize impedances at the first input and the second input of the amplifier circuit; and
a programming circuit coupled to the amplifier control circuit and configured to provide a first programming signal to the first CES element and a second programming signal to the second CES element, to program the first and second CES elements into a high impedance state or a low impedance state, wherein the programming circuit comprises:
a first programming circuit connected to the first CES element and configured to provide the first programming signal to the first CES element to program the first CES element to a first impedance state; and
a second programming circuit connected to the second CES element and configured to provide a second programming signal to the second CES element to program the second CES element to the first impedance state,
wherein the first programming circuit comprises:
a third transistor connected to the first CES element and configured to receive a program enable signal at a gate input, the program enable signal when asserted enables the first programming circuit to provide the first programming signal, wherein the third transistor is configured to achieve a voltage drop across the third transistor such that a voltage across the first CES element is lower than a first trigger voltage, wherein the first trigger voltage is a voltage at which or above which the first CES element switches from one impedance state to a different impedance state; and
a fourth transistor comprising:
a third input connected to the third transistor;
a fourth input coupled to a second power source, wherein the second power source is a programmable power source; and
a first gate input coupled to receive an analog voltage, wherein the analog voltage determines the first programming signal, and
wherein the second programming circuit comprises:
a fifth transistor connected to the second CES element and configured to receive a program enable signal at a second gate input, the program enable signal when asserted enables the second programming circuit to provide the second programming signal, wherein the fifth transistor is configured to achieve a voltage drop across the fifth transistor such that a voltage across the second CES element is lower than a second trigger voltage, wherein the second trigger voltage comprises a voltage at which or above which a second CES element switches from one impedance state to a different impedance state; and
a sixth transistor comprising:
a first terminal connected to the fifth transistor;
a second terminal coupled to the second power source, wherein the second power source comprises a programmable power source; and
a gate terminal coupled to receive the analog voltage, wherein the analog voltage determines the second programming signal.

2. The circuit as claimed in claim 1 wherein the at least one signal provided by the amplifier control circuit is dependent, at least in part, on an impedance state of the at least one CES element.

3. The circuit as claimed in claim 1 wherein the impedance state of the CES element comprises a high impedance state or a low impedance state.

4. The circuit as claimed in claim 1, wherein the CES element is coupled to both the first input and the second input of the amplifier circuit, and the amplifier control circuit provides one signal to the amplifier circuit to equalize impedances at the first and second inputs.

5. The circuit as claimed in claim 1, further comprising:
a second amplifier circuit configured to amplify an output of the amplifier circuit; and
a second amplifier control circuit coupled to the second amplifier circuit and arranged to drive the second amplifier circuit.

6. A circuit comprising:
an amplifier circuit comprising a first input to receive a first input signal, the amplifier being configured to amplify the at least one input signal; and
an amplifier control circuit comprising at least one Correlated Electron Switch (CES) element, the amplifier control circuit coupled to the amplifier and arranged to provide at least one signal to the amplifier circuit to provide a stable impedance at the first input of the amplifier circuit,
wherein the amplifier circuit comprises a second input to receive a second input signal,
wherein the amplifier circuit is configured to amplify a difference between the first input signal and the second input signal,
wherein the amplifier control circuit is configured to provide at least one signal to the amplifier circuit to equalize the impedances at the first input and the second input of the amplifier circuit, and
wherein the amplifier control circuit comprises a first CES element and a second CES element, wherein the first CES element is coupled to the first input of the amplifier circuit, and the second CES element is coupled to the second input of the amplifier circuit; a first transistor coupled to the first CES element and configured to receive the first input signal; and a second transistor coupled to the second CES element and configured to receive the second input signal,
the circuit further comprising a first enable circuit comprising:
a third transistor connected between the first transistor and the first CES element;
an fourth transistor connected between the second transistor and the second CES element; and
an enable input signal coupled to a gate input of the third transistor and a gate input of the eighth transistor, the enable input signal when asserted allows the first CES element to provide the first signal to the first transistor and the second CES element to provide the second signal to the second transistor,
wherein the seventh transistor, the fourth transistor and the enable input signal are designed to maintain a determined voltage across the first CES element and the second CES element, wherein the determined voltage is lower than a reset voltage of the first CES element and second CES element.

7. The circuit of claim 1, wherein:
the first programming circuit is configured to provide a first programming voltage and a first programming current to the first CES element to program the first CES element to the first impedance state; and
the second programming circuit is configured to provide a second programming voltage and a second programming current to the second CES element to program the second CES element to the second impedance state;
wherein the second programming voltage is greater than the first programming voltage; and
wherein the first programming current is greater than the second programming current.

8. The circuit of claim 6, wherein the first input signal comprises a bit line signal and the second input signal comprises a complementary bit line signal.

9. The circuit of claim 6, further comprising:
a fifth transistor operatively connected to the first transistor and the second transistor, and configured to cancel an offset voltage between the first transistor and the second transistor.

10. The circuit of claim 6, the amplifier circuit comprising a first differential output and a second differential output, wherein the second amplifier circuit comprises:
a sixth transistor comprising a gate input connected to the first differential output;
an seventh transistor comprising a gate input connected to the second differential output; and
an output buffer to provide an output signal from the second amplifier circuit.

11. The circuit of claim 10, further comprising a second enable circuit comprising:
a eighth transistor to enable the second differential amplifier, wherein the twelfth transistor receives the enable input at a gate terminal.

12. An apparatus comprising:
a plurality of memory cells;
a plurality of sense amplifiers, each sense amplifier coupled to at least one memory cell of the plurality of memory cells and configured to receive at least one bit line input corresponding to the at least one memory cell; and
a plurality of Correlated Electron Switch (CES) elements, coupled to the plurality of sense amplifiers, wherein a first CES element of the plurality of CES elements is coupled between a respective sense amplifier and a first power source, wherein the first CES element is programmed to a first impedance state, and wherein the first CES element provides a first signal to the respective amplifier.

13. The apparatus of claim 12, wherein at least one of the plurality of sense amplifiers comprises:
a first programming circuit connected to the first CES element and configured to provide a first programming signal to the first CES element to program the first CES element to the first impedance state; and
a second programming circuit connected to the second CES element and configured to provide a second programming signal to the second CES element to program the second CES element to the first impedance state.

* * * * *